US008466813B2

(12) United States Patent
Uemura

(10) Patent No.: US 8,466,813 B2
(45) Date of Patent: Jun. 18, 2013

(54) IDENTIFICATION OF KEY INFORMATION OF KEYBOARD

(75) Inventor: Masahiro Uemura, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 1134 days.

(21) Appl. No.: 11/778,943

(22) Filed: Jul. 17, 2007

(65) Prior Publication Data

US 2008/0018501 A1 Jan. 24, 2008

(30) Foreign Application Priority Data

Jul. 19, 2006 (JP) ................................ 2006-197274

(51) Int. Cl.
*H03M 11/00* (2006.01)

(52) U.S. Cl.
CPC ............ *H03M 11/00* (2013.01); *H03M 11/003* (2013.01); *H03M 11/006* (2013.01)
USPC .................. 341/23; 341/20; 341/21; 341/22; 345/168; 345/169

(58) Field of Classification Search
USPC .................. 341/20, 21, 22, 23; 345/168, 169
See application file for complete search history.

(56) References Cited

U.S. PATENT DOCUMENTS 4,412,209 A * 10/1983 Frame et al. .................... 341/33
4,725,816 A * 2/1988 Petterson ........................ 341/24
5,387,042 A * 2/1995 Brown ........................... 400/477
6,184,805 B1 * 2/2001 Uggmark ........................ 341/29
6,737,990 B1 * 5/2004 Chau ............................... 341/22
7,541,946 B2 * 6/2009 Fedigan ........................... 341/29
2003/0132915 A1 * 7/2003 Mitchell ....................... 345/168
2004/0036632 A1 * 2/2004 Ford ................................ 341/22
2004/0066374 A1 * 4/2004 Holloway et al. ............. 345/168
2005/0159126 A1 * 7/2005 Wang ......................... 455/226.4
2005/0259073 A1 * 11/2005 Hirano et al. ................. 345/157
2006/0061542 A1 * 3/2006 Stokic ........................... 345/156
2006/0097992 A1 * 5/2006 Gitzinger et al. ............. 345/173

FOREIGN PATENT DOCUMENTS

JP 05-61585 3/1993
JP 11-65730 3/1999

* cited by examiner

*Primary Examiner* — Hai Phan
*Assistant Examiner* — Amine Benlagsir
(74) *Attorney, Agent, or Firm* — Lieberman & Brandsdorfer, LLC

(57) ABSTRACT

A computer keyboard which enables a computer to automatically recognize nomenclature information (ID) of keys is provided. Preferably, the keyboard contains a first memory which stores a table in which nomenclature information (ID) of keys and resistance values are associated with each other, a resistor having a resistance value substantially equal to any one of the resistance values, and a controller connected to the first memory and the resistor. The controller detects the resistance value of the resistor and reads the ID of the key corresponding to the resistance value from the table.

13 Claims, 4 Drawing Sheets

| | r0 | r1 | r2 | r3 | r4 | r5 | r6 |
|---|---|---|---|---|---|---|---|
| Resistance (Ω) | 67 | 100 | 150 | 225 | 338 | 506 | 759 |

| | r0 | r1 | r2 | r3 | r4 | r5 | r6 |
|---|---|---|---|---|---|---|---|
| Resistance (Ω) | 67 | 100 | 150 | 225 | 338 | 506 | 759 |

IDENTIFICATION OF KEY INFORMATION OF KEYBOARD

BACKGROUND OF THE INVENTION

1. Field of the Invention

The present invention generally relates to a keyboard. More specifically, the present invention relates to the keyboard and a computer system which can automatically identify information, such as nomenclatures (language), a layout, or the like of keys of the computer keyboard.

2. Description of the Related Art

Computer keyboards, such as IBM PCs, have approximately five types, depending on physical layouts thereof, for example, 101 keys (US type), 106 keys (Japanese type), and the like, as a full size keyboard with a numeric keypad. In addition, there are approximately 40 types of keyboards depending on nomenclatures (languages) of the keys. In order to display characters matching with the nomenclatures of the keyboard on a display screen of the computer, it is necessary to initialize (cause the computer to recognize) key information (on the nomenclatures and the layout) of the keyboard to be used in the computer during the computer's start-up process. This initial setting means selecting of a corresponding character table of an operating system (OS) in accordance with the nomenclatures of the keyboard.

In a conventional method, this initial setting has been manually performed for a computer in accordance with information (on nomenclatures and a layout) of the keyboard to be used. A method for automatically performing the initial setting includes, for example, a method disclosed in Japanese Unexamined Patent Publication No. 5-61585. This publication discloses the method by which a controller reads an ID unique to the keyboard stored in a memory of the keyboard to transmit the ID to the computer. According to this method, however, it is required to preliminarily write the ID unique to the keyboard in the memory of the keyboard. Namely, this requires operation of inputting the corresponding ID one by one, or preparation of different memories to which a unique ID is written according to the nomenclature layout of the keyboard. Hence, this will cause an excessive trouble (entry work, or preparation and assembly of different memories by nomenclature layout of keyboards) during the manufacturing process of the keyboard, and it is much more likely to cause an inputting or assembling mistake (mismatch of the ID and the nomenclature layout).

SUMMARY OF THE INVENTION

An object of the present invention is to provide a keyboard which enables a computer to automatically recognize identification information (ID) corresponding to key information of the keyboard (on nomenclatures and a layout: hereinafter, also referred to as "nomenclature information").

Another object of the present invention is to provide a method capable of readily manufacturing this new keyboard while causing little excessive operation in the manufacturing process.

According to the present invention, a computer keyboard is provided which comprises a first memory which stores a table in which nomenclature information (ID) of keys and resistance values are associated with each other, a resistor having a resistance value substantially equal to any one of the resistance values, and a controller connected to the first memory and the resistor, the controller detecting the resistance value of the resistor and reading the ID of a key language corresponding to the resistance value from the table.

The present invention also provides a method for manufacturing a computer keyboard, the method including the steps of preparing a bottom cover including a substrate in which a resistive layer is provided therein, combining a top cover on which keys are arranged with the bottom cover, and irradiating the resistive layer with a laser beam through an opening preliminarily provided on the top cover to adjust the resistance value of the resistive layer to a predetermined value, wherein the predetermined value corresponds to the nomenclature information (ID) of the keys.

DESCRIPTION OF THE PREFERRED EMBODIMENT

Figure 1:
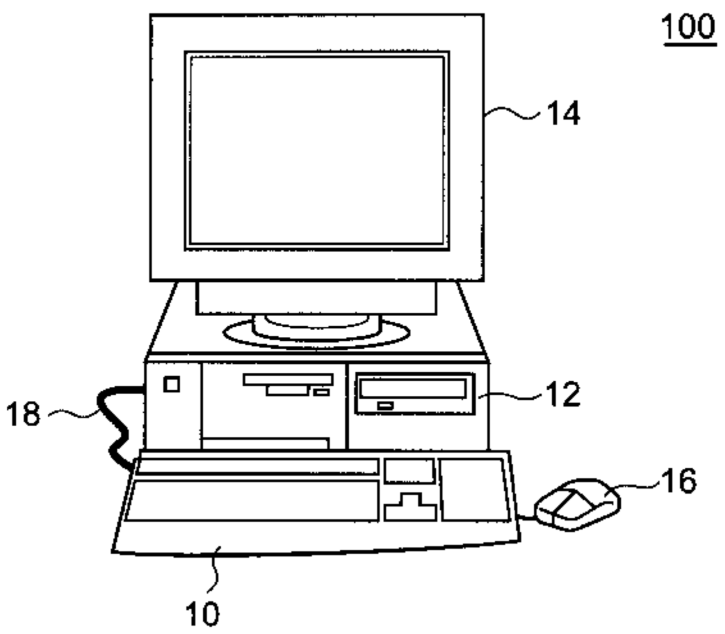
FIG. 1 is a view illustrating a configuration of a computer system which includes a keyboard of the present invention.

Hereinafter, the present invention will be described with reference to the drawings. FIG. 1 is a view illustrating a configuration of a computer system 100 including a keyboard according to the present invention. The system 100 includes a keyboard 10, a computer body 12, a display 14 and a mouse 16. The keyboard 10 is connected to the computer body 12 with a cable 18. The keyboard may be a wireless keyboard which does not require a cable to communicate with the computer body 12. The keyboard 10 may also be integrated with the computer body 12, such as is the case in a notebook computer configuration. Note herein that the computer system described in the present invention can include a large-sized computer (such as a mainframe or a server), a personal computer (PC), a notebook computer, or any information-processing device or terminal which incorporates a central processing unit and utilizes character input via a keyboard.

Figure 2A:
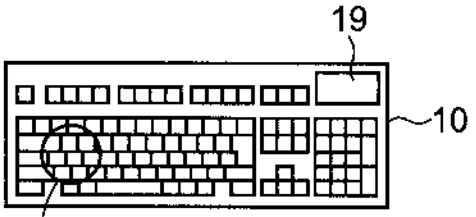
FIG. 2 is a view illustrating the keyboard of the present invention (a) and an enlarged view of a key part thereof (b)
Figure 2B:
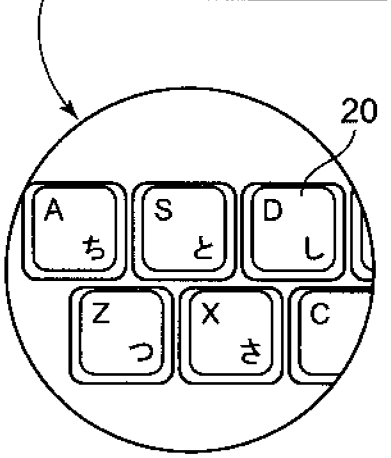

FIG. 2A is a view illustrating the keyboard 10 and FIG. 2B illustrates an enlarged view of some of the keys of the keyboard. FIG. 2A shows a 106 key (Japanese) type of keyboard. On each key 20, Japanese characters, alphanumeric characters, symbols, and the like are imprinted. The nomenclatures of the keys vary depending on keyboard types. Hence, it is required to cause the computer body 12 to recognize that the keyboard being employed therewith is a 106 key (Japanese) type.

Figure 3:
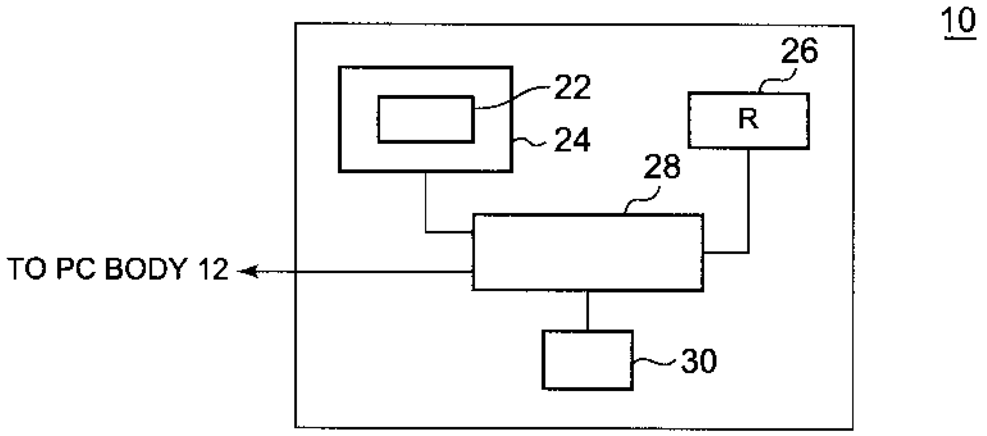
FIG. 3 is a block diagram illustrating a configuration of the computer keyboard of the present invention.

FIG. 3 is a block diagram illustrating a configuration of the computer keyboard of the present invention. The keyboard 10 includes a first memory 24, a resistor portion 26, a controller 28 connected to the first memory 24 and the resistor portion 26, and a second memory 30 connected to the controller 28. The first memory 24 and the second memory 30 may be incorporated in the controller 28. The first memory 24, for example, may be a ROM (read only memory), while the second memory 30 may be a RAM (random access memory). These memories may be other types of semiconductor memories. The first memory 24 stores a table 22 in which nomenclature information (ID) of the keys and resistance values are associated with each other. The resistor portion 26 has a resistance value substantially equal to any one of the resistance values in the table 22. The controller 28 detects the resistance value of the resistor portion 26 and reads the ID of the key language corresponding to the resistance value from the table 22. The ID read is temporarily saved in the second memory 30. The controller 28 can transmit the ID saved in the second memory 30 to the computer body 12 (FIG. 1). The computer body 12 selects (initializes) a relevant character table of an operating system (OS) in accordance with the received ID. The controller 28 may be an 8-bit microcomputer unit (MCU) having a plurality of I/O ports, for example.

Figure 4:
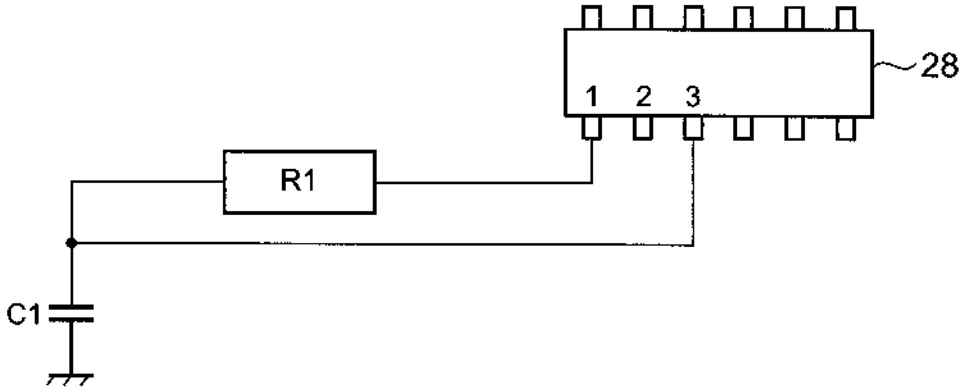
FIG. 4 is a detailed view of a resistor portion 26 and a controller 28 illustrated in FIG. 3.

FIG. 4 is a detailed view of the resistor portion 26 and the controller 28 of FIG. 3. In FIG. 4, a capacitor C1 is connected to a resistor R1 to constitute an RC circuit having a time constant R1*C1. One end of the resistor R1 is connected to an output port 1 of the controller 28 (MCU), while the other end thereof is connected to a port 3 of the MCU 28. The MCU 28 applies high voltage (V0) to port 1 and measures time T until a potential of port 3 reaches a given potential (Vih). The given potential is a CMOS level of high potential (High), for example. In this case, the time T can be estimated through the following formula:

$$T=C1*R1*1n(V0/(V0-Vih)) \quad (1)$$

For example, if it is estimated that C1=100 μF, V0=5 V, and Vih=3.16 V, then $$T=0.1*R1(\text{ms}) \quad (2)$$

Since the time T changes depending on the resistance value of the resistor R1, it is possible to detect the resistance value of the resistor R1 by measuring the time T.

Table 1 illustrates the time T in case of having changed the resistance value at seven values from r0 to r6. In the table, the T min and the T max represent values in 80% and 120% of the time T calculated by the formula (1) or the formula (2), respectively. These seven resistance values can be identified (detected) from a relation between the resistance R and the time T in Table 1.

TABLE 1

| | r0 | r1 | r2 | r3 | r4 | r5 | r6 |
|---|---|---|---|---|---|---|---|
| Resistance (Ω) | 67 | 100 | 150 | 225 | 338 | 506 | 759 |
| C1 (μF) | 100 | 100 | 100 | 100 | 100 | 100 | 100 |
| T = CR (ms) | 6.68 | 10.00 | 15.00 | 22.50 | 33.75 | 50.63 | 75.94 |
| T Min (ms) | 5.33 | 8.00 | 12.00 | 18.00 | 27.00 | 40.50 | 80.75 |
| T Max (ms) | 8.00 | 12.00 | 18.00 | 27.00 | 40.50 | 60.75 | 91.25 |

Figure 5:
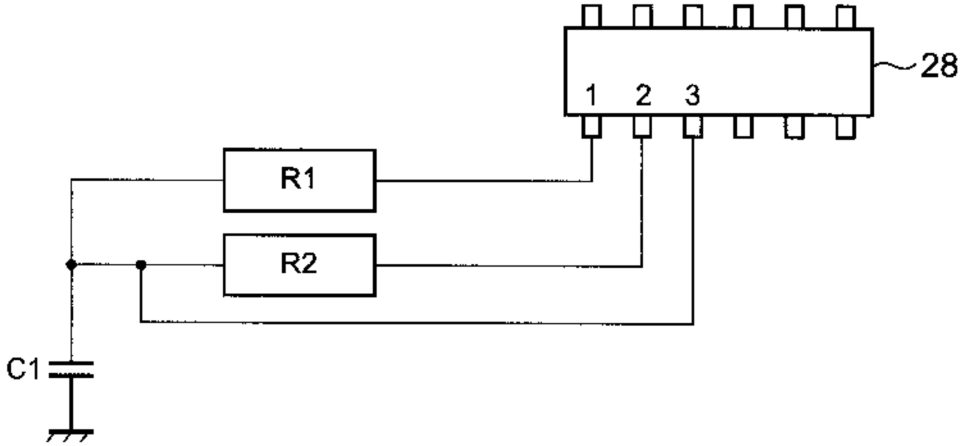
FIG. 5 is another detailed view of the resistor portion 26 and the controller 28 illustrated in FIG. 3.

FIG. 5 is another detailed view of the resistor portion 26 and the controller 28 of FIG. 3. In FIG. 5, two resistors R1 and R2 are connected in parallel with the capacitor C1. One end of the resistor R1 is connected to port 1 of the MCU 28, and one end of the resistor R2 is connected to port 2 of the MCU 28, respectively. The other ends of the two resistors are connected to port 3 of the MCU 28. There are two resistors in FIG. 5, and therefore when the relation in Table 1 is premised on, it is possible to set up a maximum of 7*7=49 kinds of the resistance values in combination with the resistors R1 and R2. Increasing the number of resistors enables further increasing of the number of combinations of the resistance values (R1, R2, R3 . . . ) as required. Table 2 illustrates a relation between the resistance values and the key IDs of the keyboard in case of using the configuration in FIG. 5 and the resistance values in Table 1. Table 2 shows 25 IDs of the 49 kinds in total. For example, as for the US English in the first line, since the resistors R1 and R2 take the combination of (r0, r0), the ID is represented as “00”. As for Japanese in the 20th line, since the resistors R1 and R2 take the combination of (r2, r5), the ID is represented as “13”.

TABLE 2

| | R1 | | | | | | | R2 | | | | | | | ID |
|---|---|---|---|---|---|---|---|---|---|---|---|---|---|---|---|
| IMPRINTED LANGUAGE | r0 | r1 | r2 | r3 | r4 | r5 | r6 | r0 | r1 | r2 | r3 | r4 | r5 | r6 | (hex) |
| US English | 1 | | | | | | | 1 | | | | | | | 00 |
| Arabic | 1 | | | | | | | | 1 | | | | | | 01 |
| Belgium/French | 1 | | | | | | | | | 1 | | | | | 02 |
| Belgium/UK | 1 | | | | | | | | | | 1 | | | | 03 |
| Brazil/Portuguese | 1 | | | | | | | | | | | 1 | | | 04 |
| Bulgarian | 1 | | | | | | | | | | | | 1 | | 05 |
| Chinese/US | 1 | | | | | | | | | | | | | 1 | 06 |
| Czech | | 1 | | | | | | 1 | | | | | | | 07 |
| Czech (ABB) | | 1 | | | | | | | 1 | | | | | | 08 |
| Danish | | 1 | | | | | | | | 1 | | | | | 09 |
| Dutch | | 1 | | | | | | | | | 1 | | | | 0A |
| French | | 1 | | | | | | | | | | 1 | | | 0B |
| French Canadian | | 1 | | | | | | | | | | | 1 | | 0C |
| Geman | | 1 | | | | | | | | | | | | 1 | 0D |
| Greek | | | 1 | | | | | 1 | | | | | | | 0E |
| Hebrew | | | 1 | | | | | | 1 | | | | | | 0F |
| Hungarian | | | 1 | | | | | | | 1 | | | | | 10 |
| loeland | | | 1 | | | | | | | | 1 | | | | 11 |
| Italy | | | 1 | | | | | | | | | 1 | | | 12 |
| Japanese | | | 1 | | | | | | | | | | 1 | | 13 |
| Korian | | | 1 | | | | | | | | | | | 1 | 14 |
| LA Spanish | | | | 1 | | | | 1 | | | | | | | 15 |
| Norwegian | | | | 1 | | | | | 1 | | | | | | 16 |
| Polish | | | | 1 | | | | | | 1 | | | | | 17 |
| Portuguese | | | | 1 | | | | | | | 1 | | | | 18 |

Figure 6:
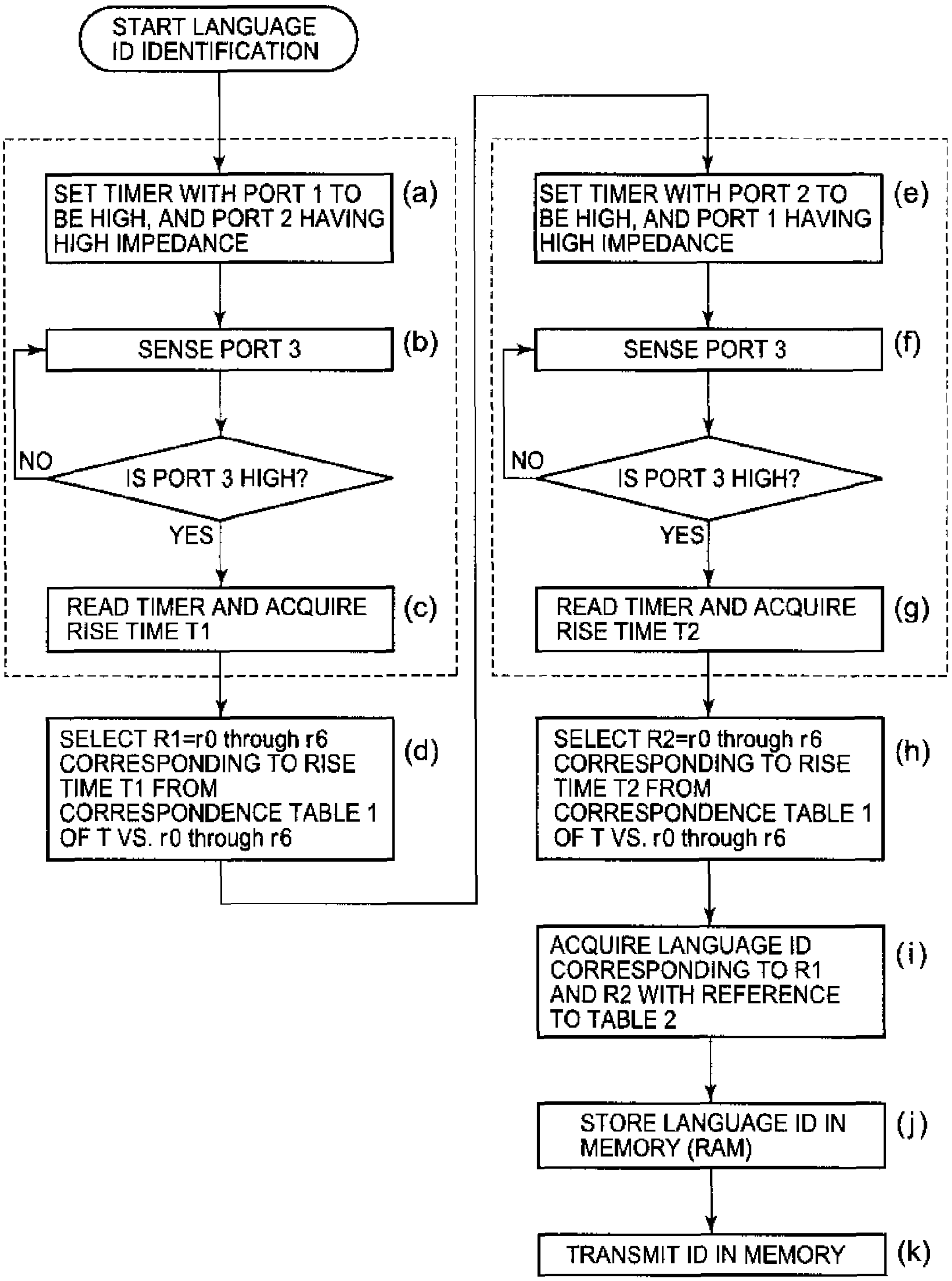
FIG. 6 is a view illustrating a flow of an identification (detection) method of a language ID according to the present invention.

FIG. 6 is a flow chart illustrating an identification (detection) method of the ID in case of using the configuration in FIG. 5 and Tables 1 and 2. First, the resistor R1 is measured. The port 1 of the MCU 28 is set to high potential, and the port 2 is set to high impedance. Simultaneously, a timer in the MCU 28 is set (time measurement is initiated) (a). It is detected whether the potential of port 3 of the MCU 28 is high or low (b). A value of the timer is read when the potential of port 3 reaches high, and rise time T1 is measured, after the port 1 is set to high potential until the port 3 reaches high potential (c). With reference to Table 1, a resistance value r (one of r0 to r6) corresponding to T1 is selected as R1 (d). Next, the resistor R2 is measured in a similar manner. The port 2 of the MCU 28 is set to high potential, and the port 1 is set to high impedance. Simultaneously, the timer in the MCU is set (time measurement is initiated) (e). It is detected whether the potential of the port 3 of the MCU 28 is high or low (f). The value of the timer is read when the potential of the port 3 reaches high, and rise time T2 is measured, after the port 2 is set to high potential until the port 3 reaches high potential (g). With reference to Table 2, the ID is acquired corresponding to the combination of R1 and R2 (rx, ry)(i). The ID acquired is stored in the memory 30 (j). Finally, the ID in the memory is transmitted to the computer body at a given time (k). A series of the flows mentioned above is performed in a BAT (Basic Assurance Test) performed when the computer is activated.

Then, a method for manufacturing the keyboard of the present invention will be described. First, a bottom cover is prepared. In the bottom cover, there is a substrate provided with a resistive layer therein. Next, a top cover having the keys arranged thereon is combined with the bottom cover. The resistive layer is irradiated with a laser beam through an opening preliminarily provided on the top cover, and thereby the resistance value of the resistor is adjusted to a predetermined value. At this time, the predetermined value corresponds to the ID assigned to the nomenclature information (language of the nomenclature) of the key of Table 2. The resistive layer is provided in an opening 19 formed on a keyboard surface of FIG. 2, for example, along with the MCU 28 and the capacitor C1. The laser beam is irradiated on the resistive layer through the opening 19. Note herein that the opening 19 (FIG. 2) need not be a complete opening, but it may have a slit shape having the opening through which the laser beam can pass. In case of being a complete opening, the opening is closed with a lid after adjustment of the resistance value. This laser beam irradiation has an advantage that it is not necessary to add an extra process since it is possible to utilize the laser beam in a conventional laser printing process for imprinting the keys using the laser beam. In addition, since the resistance value is simultaneously adjusted when characters are actually printed to the key, it is much more likely that the resistance value corresponding to the character language (ID) can be reliably set up. Namely, there are few dangers that neither of the resistance value and the character language will be matched. Incidentally, in a conventional Tampo print which does not use the laser beam, this laser process is newly required.

Figure 7:
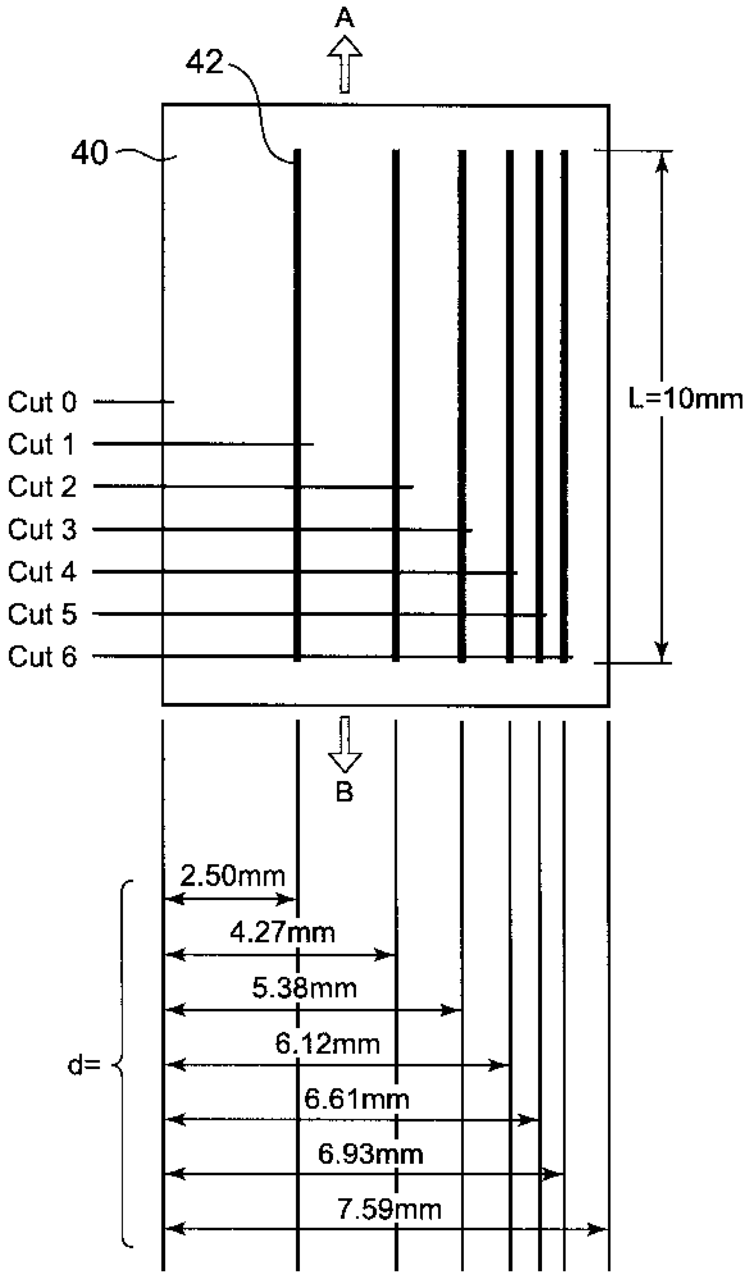
FIG. 7 is a view illustrating an example of laser trimming (cutting) of a resistive layer according to the present invention.

FIG. 7 illustrates an example of laser trimming (cutting) of the resistive layer. A resistive layer 40 is firmly fixed on the substrate with an ultraviolet (UV), after a resistive material in a paste form is printed on a printed circuit board of the keyboard. Then, six slits 42 are provided on the resistive layer in a longitudinal direction. The slits are provided (trimmed) by irradiating the laser beam. Alternatively, in case of printing the paste, the paste may be printed making a narrow room. In the example of FIG. 7, a carbon paste with resistivity of $\rho=2.5\times10^{-3}$ Ωm is used as the resistive material. The size thereof is 10 mm long and 8 mm wide. A cut is made (trimmed) with the laser beam from a transverse direction of the resistive layer 40. Since the width of the resistive layer serving as a current path becomes shorter depending on a cut length d, it is possible to increase the resistance value between A and B. Namely, in cut lengths from Cut 0 to Cut 6 in FIG. 7, the resistance values vary from r0=67Ω to r6=759Ω in Table. In this manner, it is possible to acquire the resistance values from r0 to r6 shown in Table 1. In addition, it is possible, as has been conventionally carried out, to adjust the resistance value according to the number of the cuts (the number of the laser trimming) made on the resistive layer. It is also possible to make the resistive layer through a method for printing the paste of $RuO_2$ or the like on a ceramic substrate and sintering the same. In that case, it is possible to form the resistive layer with higher precision and higher reliability. However, the cost of manufacturing will be increased.

The present invention has been described taking FIGS. 1 to 7 and Tables 1 and 2 as examples. However, the present invention should not be limited to these embodiments. It will be understood by those skilled in the art that various changes in form may be made without departing from the spirit of the present invention.

The invention claimed is:

1. A keyboard operatively connectable to a computer body, said keyboard comprising:

a first memory to store a table in which identification codes of nomenclature layouts are associated with resistance values;

at least one resistor having a resistance value substantially equal to any one of the resistance values identified in the table, said at least one resistor to define an identification code of a nomenclature layout of the keyboard, and said at least one resistor comprises a resistive layer;

a controller connected to said first memory and said at least one resistor, said controller identifying the resistance value of said at least one resistor and reading the identification code of the nomenclature layout corresponding to the resistance value from the table; and the controller transmitting said identification code to the computer body, the computer body selecting a relevant character table of an operating system based upon the identification code; and a top cover on which keys are arranged, wherein the top cover has an opening corresponding to the position of the resistive layer for irradiating the resistive layer with a laser beam to adjust a resistance value of the resistive layer to a predetermined value.

2. The keyboard according to claim 1, wherein said resistive layer preliminarily provided in the keyboard, and the resistance value of the resistor is adjusted by laser trimming of the resistive layer.

3. The keyboard according to claim 1, said keyboard further comprising a second memory for storing the identification code read out by said controller, wherein said controller can transmit the identification code stored in said second memory to the computer body.

4. The keyboard according to claim 3, wherein said controller is a microcomputer unit, said first memory is a ROM, said second memory is a RAM, and at least one of the ROM and the RAM is incorporated in the microcomputer unit.

5. The keyboard according to claim 1, further comprising a capacitor connected to said resistor and said controller, wherein said controller detects a corresponding resistance value from a voltage change dependent on a time constant determined by said resistor and the capacitor.

6. The keyboard according to claim 1, further comprising first and second resistors connected in parallel, the first resistor having a first resistance value and the second resistor having a second resistor value, the first and second resistors connected to different ports of the controller, said controller to identify the first and second resistance values.

7. The keyboard according to claim 6, further comprising a combination of the first and second resistor values associated with at least one identification code.

8. The keyboard according to claim 7, wherein an increase in a quantity of resistors increases a quantity of combinations of resistance values, and each combination associated with at least one identification code of the nomenclature layout of the keyboard.

9. A method for causing a computer to recognize an identification code of a nomenclature layout of a keyboard connected to the computer, comprising the steps:

communicating with a memory by the keyboard, wherein the memory storing a table of identification codes of nomenclature layouts associated with identified resistance values, at least one resistor having a resistance value substantially equal to any one of the resistance values identified in the table, wherein the at least one resistor comprises a resistive layer; and a controller connected to the resistor;

identifying the resistance value of the resistor by the controller when the keyboard is activated, reading the identification code corresponding to the detected resistance value from the table;

arranging keys on a top cover, wherein the top cover has an opening corresponding to the position of the resistive layer for irradiating the resistive layer with a laser beam to adjust a resistance value of the resistive layer to a predetermined value; and transmitting by the controller the read identification code to the computer to cause an operating system associated with the computer to recognize the identification code and select a relevant character table of the operating system corresponding to the nomenclature layout based upon the identification code.

10. The method according to claim 9, wherein the resistor comprises a resistive layer preliminarily provided in the keyboard, and the resistance value of the resistor is adjusted by laser trimming of the resistive layer.

11. A non-transitory memory device having a program product for causing a computer to recognize nomenclature information of keys of a keyboard connected to a computer, wherein the keyboard includes a memory which stores a table in which the nomenclature information and resistance values are associated, at least one a resistor having a resistance value substantially equal to any one of the resistance values identified in the table, and a controller connected to the resistor, said program product causing the controller to perform the steps of:

identifying the resistance value of the at least one resistor, when the keyboard is activated, said at least one resistor defining an identification code of a nomenclature layout of the keyboard and said at least one resistor comprises a resistive layer;

reading the nomenclature information corresponding to the detected resistance value from the table; and transmitting the nomenclature information read from the table to an operating system associated with the computer and selecting a relevant character table of the operating system corresponding to a nomenclature layout based upon the nomenclature information.

irradiating the resistive layer with a laser beam through an opening preliminarily provided on the top cover to adjust a resistance value of the resistive layer to a predetermined value.

12. A method for manufacturing a keyboard connectable to a computer body, said method comprising the steps of:

preparing a bottom cover including a substrate in which a resistive layer is provided therein;

combining a top cover on which keys are arranged with the bottom cover; and irradiating the resistive layer with a laser beam through an opening preliminarily provided on the top cover to adjust a resistance value of the resistive layer to a predetermined value, wherein the predetermined value responds to an identification code of the nomenclature layout.

13. The method according to claim 12, wherein the step of adjusting the resistance value to the predetermined value is carried out by adjusting the resistance value depending on an amount of trimming by the laser beam.

* * * * *